(12) United States Patent
Karpman

(10) Patent No.: US 6,828,674 B2
(45) Date of Patent: Dec. 7, 2004

(54) HERMETICALLY SEALED MICROSTRUCTURE PACKAGE

(75) Inventor: Maurice Karpman, Brookline, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/164,064

(22) Filed: Jun. 5, 2002

(65) Prior Publication Data

US 2003/0006502 A1 Jan. 9, 2003

Related U.S. Application Data

(62) Division of application No. 09/546,864, filed on Apr. 10, 2000, now Pat. No. 6,441,481.

(51) Int. Cl.[7] .......................... H01L 23/18; H01L 21/44
(52) U.S. Cl. ..................... 257/711; 257/678; 257/788; 257/794; 438/26; 438/110; 438/113
(58) Field of Search ............................... 257/678, 680, 257/704, 710, 711, 737, 738, 773, 774, 777, 778, 784, 787, 788, 790, 794; 438/25–33, 110, 113, 114, 460–462, 465, 613

(56) References Cited

U.S. PATENT DOCUMENTS

| | | |
|---|---|---|
| 5,061,987 A | 10/1991 | Hsia |
| 5,285,131 A | 2/1994 | Muller et al. |
| 5,551,903 A | 9/1996 | Kumar et al. |
| 5,610,438 A | 3/1997 | Wallace et al. |
| 5,614,353 A | 3/1997 | Kumar et al. |
| 5,767,575 A | 6/1998 | Lan et al. |
| 5,895,233 A | 4/1999 | Higashi et al. |
| 5,915,168 A | 6/1999 | Salatino et al. |
| 6,020,219 A | 2/2000 | Dudderar et al. |
| 6,051,866 A | 4/2000 | Shaw et al. |
| 6,093,330 A | 7/2000 | Chong et al. |
| 6,124,637 A * | 9/2000 | Freyman et al. ............ 257/736 |
| 6,142,358 A | 11/2000 | Cohn et al. |
| 6,192,757 B1 | 2/2001 | Tsang et al. |
| 6,207,477 B1 * | 3/2001 | Motooka et al. ............ 438/113 |
| 6,214,644 B1 | 4/2001 | Glenn |
| 6,228,675 B1 | 5/2001 | Ruby et al. |
| 6,401,545 B1 * | 6/2002 | Monk et al. .................. 73/756 |
| 6,415,505 B1 * | 7/2002 | Glenn ......................... 29/852 |
| 2001/0003377 A1 | 6/2001 | Yoo et al. |

FOREIGN PATENT DOCUMENTS

| | | | |
|---|---|---|---|
| JP | 406066673 A | | 3/1994 |
| JP | 2000183205 | | 6/2000 |
| JP | 2001-102478 | * | 4/2001 |

OTHER PUBLICATIONS

"The Evolution of a New Wafer–Level Chip–Size Package," Vincent DiCaprio et al., Chip Scale Review, May/Jun. 1999, pp. 31–35.

Low–Cost HARMS Process,: Roger Bischofberger et al., 6 pages.

* cited by examiner

Primary Examiner—Kamand Cuneo
Assistant Examiner—Asok Kumar Sarkar
(74) Attorney, Agent, or Firm—Wolf, Greenfield & Sacks, P.C.

(57) ABSTRACT

A hermetically sealed wafer scale package for micro-electrical-mechanical systems devices. The package consists of a substrate wafer which contains a microstructure and a cap wafer which contains other circuitry and electrical connectors to connect to external applications. The wafers are bonded together, and the microstructure sealed, with a sealant, which in the preferred embodiment is frit glass. The wafers are electrically connected by a wire bond, which is protected by an overmold. Electrical connectors are applied to the cap wafer, which are electrically linked to the outputs and inputs of the microstructure. The final package is small, easy to manufacture and test, and more cost efficient than current hermetically sealed microstructure packages.

49 Claims, 4 Drawing Sheets

HERMETICALLY SEALED MICROSTRUCTURE PACKAGE

This application is a divisional of U.S. application Ser. No. 09/546,864, filed on Apr. 10, 2000, entitled "Hermetically Sealed Microstructure Package" and now U.S. Pat. No. 6,441,481.

FIELD OF THE INVENTION

The present invention relates to semiconductor devices, and more particularly, to a protective cover arrangement for a semiconductor substrate containing micro-mechanical devices, wherein the cover arrangement offers more desirable protection and manufacturing characteristics.

BACKGROUND OF THE INVENTION

A variety of semiconductor devices may be formed on a substrate according to several known techniques. The semiconductor devices may perform, for examples, electrical, mechanical, optical, or other functions, or combinations of such functions.

Often, a semiconductor wafer serves as a substrate for such devices. The devices may be fabricated from the semiconductor material of the substrate wafer itself using a variety of known processes, such as growth of various material layers on a surface of the substrate, ion implantation, diffusion, oxidation, photolithography, etching and many other processes. During fabrication, typically, at least some portion of each device is formed "within" the substrate wafer, below the surface of the substrate, and may additionally include particular topographic or structural features on the substrate surface.

Alternatively, semiconductor devices may be fabricated from a first semiconductor wafer, and subsequently mounted on a second semiconductor wafer or other type of material that serves as a substrate. The semiconductor devices fabricated from the first wafer may be mounted on the substrate either as individual devices or groups of devices. In this case, the devices "reside on" the substrate, as opposed to being "fabricated from" the substrate, as discussed above.

For purposes of the present invention, either of the foregoing examples of substrates, namely, substrates on which semiconductor devices reside, and/or from which semiconductor devices are fabricated, is referred to as a "device" substrate. A device substrate may include one or a large number of devices.

Many known semiconductor devices are extremely fragile and/or sensitive to environmental hazards. Some examples of such hazards include contamination by dust or other particles, moisture, and inadvertent scratching or other damage to portions of the surface of the devices.

Functional defects may result from one or more environmental hazards, as discussed above, and are a major cause of low device yield and other malperformance characteristics. Device damage due to any number of such hazards may occur, for example, during the process of "dicing" (separating the device substrate into individual devices), as well as during packaging of devices. Often, the number of functioning devices remaining after dicing and packaging is markedly reduced due to defects resulting from environmental hazards.

Various techniques are known in the art for protecting semiconductor devices on a substrate from such hazards. One of these techniques includes bonding a protective semiconductor cap wafer to a device substrate before dicing the substrate into individual devices. This technique has been employed particularly with wafer substrates of semiconductor devices that include micro-machined parts or microscopic mechanisms fabricated on the surface of the substrate, such as micro-electrical-mechanical systems, or MEMS. These devices are also referred to as microstructures.

According to one known technique for protecting semiconductor micro-mechanical devices, an entire device substrate wafer is capped with another wafer using a pattern of glass-like posts called "frit glass" as a bonding agent. In this technique, the micro-mechanical devices are hermetically sealed inside an open cavity formed by the frit glass pattern, the device substrate and the cap wafer. Hermetic sealing refers to a particular standard for sealing that is known in the art. Accordingly, any micro-mechanisms are free to move within a cavity while simultaneously being protected from various environmental hazards, such as particulate contamination.

According to the technique discussed above, the cap wafer is typically another semiconductor wafer of the same type as that used for the device substrate (for example, silicon or gallium arsenide). As a result, the cap wafer has essentially identical thermal characteristics to that of the device substrate. Such a choice of cap wafer results in avoiding most mechanical stresses that may result from a thermal mismatch between the cap wafer and the device substrate. For example, extreme mechanical stress can occur during a high temperature heat treatment necessary to ensure adequate bonding of the frit glass to the cap wafer and the device substrate. Any mechanical stress can severely damage or even destroy the devices on the substrate, and usually would degrade the accuracy of many delicate micro-machined devices, such as microscopic mechanical sensors or other MEMS.

After the micro-mechanism has been protected by wafer capping, the individual devices must be prepared for connection to external circuits. This process consists of separating the individual devices through dividing the substrate into individual devices, called "singulating" or "dicing." After singulation, the devices are placed into individual containers that provide mechanical protection and electrical connections to the microstructures. This process is called "packaging." This process of fabricating micro-mechanism packages is time consuming, expensive and results in large devices, as a consequence of processing the individual devices as individual devices.

FIG. 1 shows a cross-sectional view of sheet of devices before singulation. FIG. 2 shows a cross-sectional view of one of these singulated but unpackaged devices 5. A microstructure 12 rests on a wafer substrate 10 and is enclosed by glass frits 22 and a cap wafer 20. The electrical connector 14 connects to the microstructure 12 through the wafer substrate 10. The singulated device 6 is then connected to a lead frame 8 by the electrical connectors 4. This is shown in FIG. 3. This device is then packaged and results in the singulated MEMS package 6 as shown in FIG. 4. The package 2 surrounds the device 5 while the electrical leads 4 provide an electrical connection from the device 5 to the outside of the package 2. The package 2 serves to the protect the device 5 from external hazards.

In order to create the individual packaged device 6, each device 5 needs to be placed in the package 2 individually. The final singulated device package 6 is considerably larger than the singulated device itself 5.

Accordingly, what is needed, therefore, is improved packaging which still provides the necessary protection, space and connectibility to the microstructure contained inside.

SUMMARY OF THE INVENTION

Accordingly, the present invention is directed to a hermetically sealed wafer scale package for MEMS devices. According to the method and apparatus of one embodiment of the invention, a MBMS substrate wafer with microstructures is hermetically sealed to a cap wafer with fabricated circuitry to form an assembly. The cap wafer is preferably patterned before being attached to the device substrate to form the assembly. A wafer saw is then used to singulate the cap wafer and wire bond is attached to electrically connect the cap wafer to the MEMS wafer. Overmold is then applied to the structure to protect the wire bond. Solder balls are then attached to the cap wafer and the wafer saw is used to singulate the assembly into packaged MEMS devices.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

In view of the foregoing, it would be advantageous to protect semiconductors such as MEMS devices, on a "wafer" level; namely, simultaneously protecting one or more devices residing on or fabricated from a device substrate, as opposed to protecting individual devices after the device wafer has been diced. Furthermore, it would be advantageous to manufacture these devices in such a way that they will be easily connected to their external applications using a minimum of space and a minimum of manufacturing processes.

In the preferred embodiment of the invention, circuitry is fabricated directly on the top surface of the cap wafer. This can be done either before or after bonding, although before is preferable. If the wafer is conductive, the circuitry needs to be insulated by oxide or a deposited dielectric. Finally, the circuitry needs to be electrically connectable to other elements. This metal connection layer is covered by a protective dielectric layer. This layer has gaps which are filled by solder balls. These balls serve as the electrical connectors to the final packaged device.

In an alternative embodiment, a flex circuit is attached to the cap wafer rather than the circuitry being fabricated directly on the surface of the cap wafer. In this embodiment the flex circuit is attached to the cap wafer using an adhesive material. This flex circuit consists of a first level dielectric, a metalization layer, and a second level dielectric. The first level dielectric serves to secure the flex circuit to the adhesive. The metalization layer provides the electrical connection along the flex circuit. The second level dielectric serves to protect the metalization from outside interference and to contain the solder ball which will provide the package's electrical connection to external applications.

A cap wafer attached to the device substrate prior to dicing and packaging provides more robust devices by preventing particles from collecting over sensitive surfaces of the devices and scratching the surfaces.

By fabricating circuitry directly onto the cap wafer, or alternatively, by attaching a flex circuit to the cap wafer, and then by connecting this cap layer to the MEMS layer, the structure allows external devices to connect directly to the cap layer without the need of a further package structure or step, thereby creating a much smaller, more manageable, and faster produced single packaged device than is available in the prior art.

Figure 1:
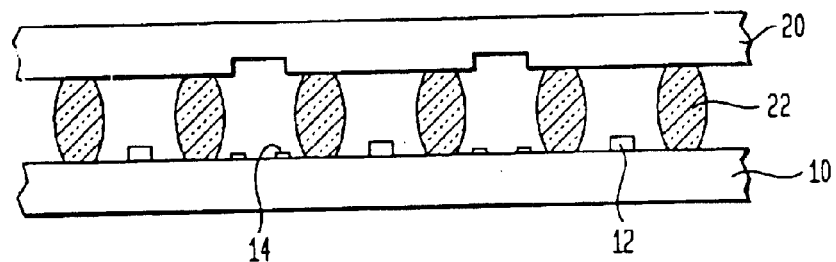
FIG. 1 is a cross-sectional view of a MEMS package assembly according to the prior art.
Figure 2:
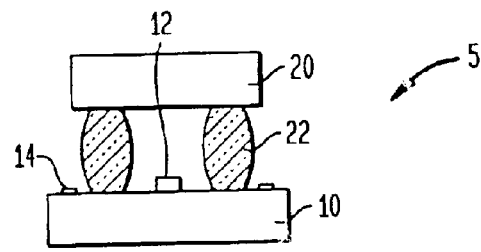
FIG. 2 is a cross-sectional view of a single MEMS package according to the prior art.
Figure 3:
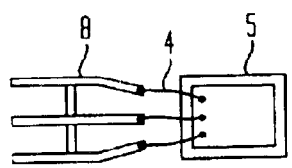
FIG. 3 is a plan view of a capped MEMS die connected to a lead frame prior to being molded into a package, according to the prior art.
Figure 4:
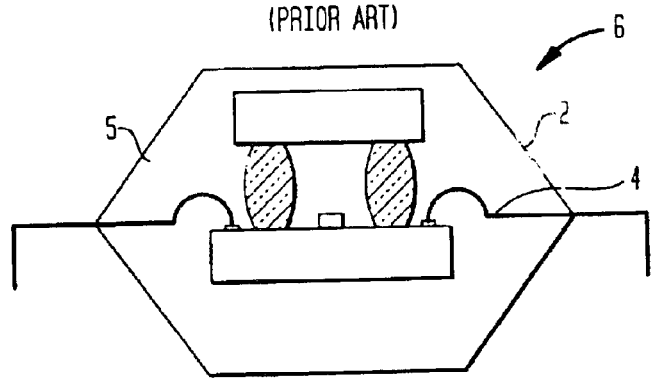
FIG. 4 is a cross-sectional view of a MEMS packaged device, fully contained with lead wires, according to the prior art.
Figure 5:
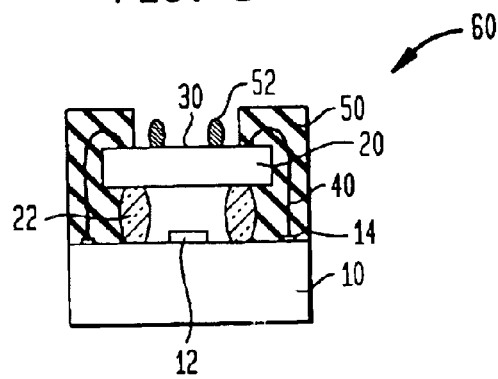
FIG. 5 is a cross-sectional view of a hermetically sealed MEMS device in a wafer scale package according to one embodiment of the invention.

FIG. 5 shows a cross-section of a hermetically sealed wafer scale MEMS package 60. A microstructure 12, that is being protected, rests atop a wafer substrate 10 and is attached thereto. The wafer substrate is connected to a cap layer 20 by frit glass 22. The cap wafer 20, frit glass 22, and wafer substrate 10, serve to protect and hermetically seal the microstructure 12 so that it may operate without hazards caused by foreign objects. An electrical signal allows the microstructure 12 to communicate with the external world. The electric signal from the microstructure 12 is carried through the wafer substrate to the electrical connector 14. The wire bond 40 connects the microstructure electrical connection 14 to additional circuitry on the cap wafer 30. An overmold 50 protects the wire bond 40 and electrical connector 14 from external damage. The overmold 50 is typically an epoxy, filled with silica to reduce thermal expansion. It is poured in between the frit glass posts 22 and then hardens to cover and hold in place the electrical connectors 14. Electrical connectors connect the cap circuitry 30 to external devices. Solder balls 52 provide a means of electrically connecting the flex circuit to external circuitry. By connecting to the cap circuitry 30, the electrical connectors are also connected to the microstructure 12. The device of the invention may be manufactured by the inventive process described below.

The process of creating a hermetically sealed wafer scale MEMS package begins with a wafer substrate containing the microstructures. The application of frit glass is the next step of manufacturing for a hermetically sealed wafer package for MEMS device.

Figure 6:
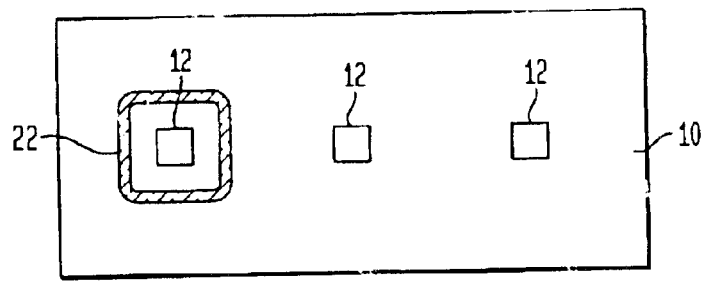
FIG. 6 is a diagram of a plan view of a microstructure substrate.

FIG. 6 shows a plan view of a wafer substrate 10 containing microstructures 12.

Figure 7:
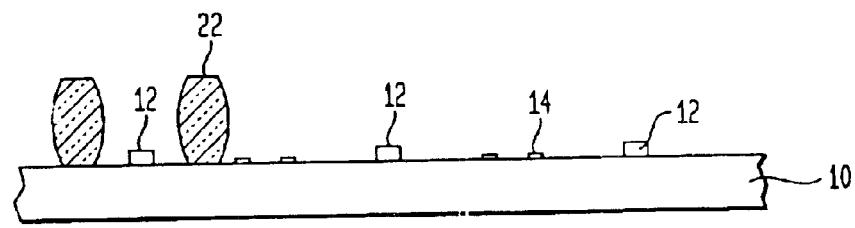
FIG. 7 shows a cross-sectional view of a MEMS wafer substrate, in a step of the invention.

The left-most microstructure is surrounded by a ring of frit glass 22. FIG. 7 shows a cross-sectional view of the same wafer substrate. The microstructures 12 are fabricated onto the wafer substrate 10. Electrical connections 14, which provide connections to the microstructure, are also fabricated into the substrate.

Figure 8:
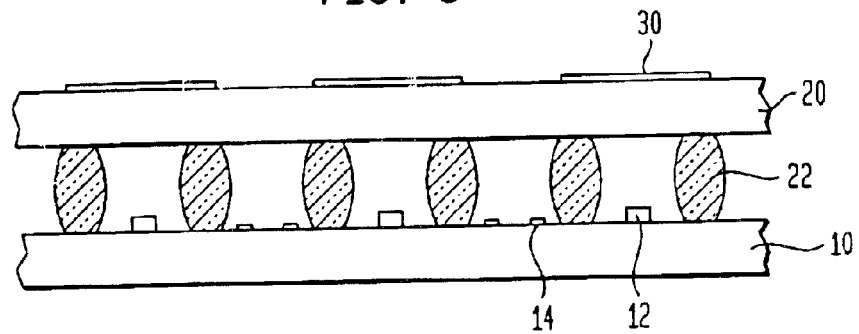
FIG. 8 shows a cross-sectional view of a further step of the invention.

At the next step of the process, the flit glass 22 is placed on the wafer substrate so that it surrounds the microstructure. The cap wafer 20 then is pressed to the frit glass 22 to hermetically seal the microstructures, as shown in FIG. 8. The entire assembly then is cooled so that the frit 22 becomes solid glass and forms a seal surrounding the microstructure 12. As shown in FIG. 8, each of the microstructures 12 is thus hermetically sealed within an individual cavity that is not completely filled during the sealing process, thereby allowing movement of the microstructure 12 within the cavity.

According to the preferred embodiment of the invention, prior to being sealed to the frit glass 22, the cap wafer 20 is prefabricated with individual circuits 30 along its surface. These circuits 30 are lined up directly above the microstructure 12 when the cap wafer 20 is sealed to the substrate wafer 10.

Figure 9:
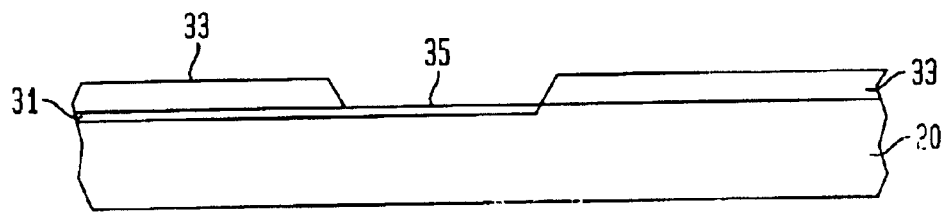
FIG. 9 shows a cross-sectional view close-up of the cap wafer according to a further step of the invention.

FIG. 9 shows a close-up of the cap wafer 20 according to the preferred embodiment of the invention. A dielectric 33 is attached above the cap layer 20 in such a way that it protects the electrical connector 31 while creating an opening 25 which allows external devices to electrically connect to the circuitry on the cap wafer. The external devices connect at the dielectric gap 35 to the electrical connector 31, which, in turn, connects to the circuitry 30 fabricated on the cap wafer 20.

Figure 10:
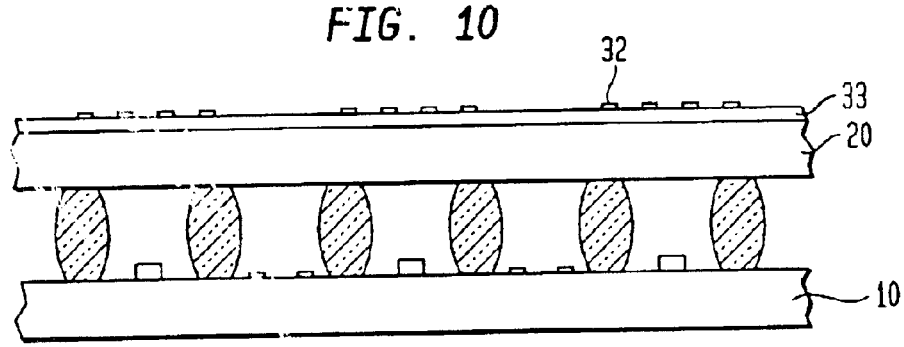
FIG. 10 shows a cross-sectional view of an alternative embodiment of a further step of the invention.
Figure 11:
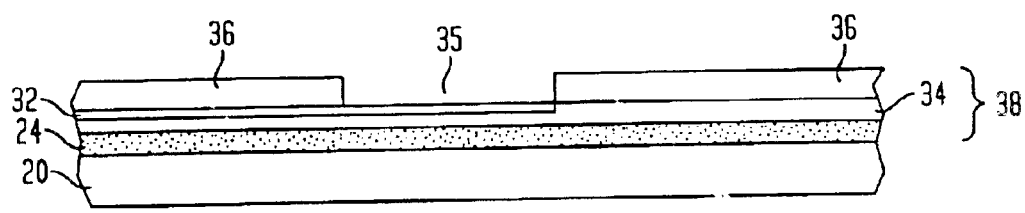
FIG. 11 shows a cross-sectional view close up of the cap wafer according to one step of the invention.

FIG. 10 shows a cross-sectional view of the substrate wafer 10 and the cap wafer 20 according to an alternative embodiment of the invention. According to this embodiment, a flex circuit 38 containing circuitry 32 is attached to the cap wafer 20. FIG. 11 shows a close up of the cross-sectional view of the flex circuit 38 attached to the cap wafer 20. The flex circuit consists of a first level dielectric 34, circuitry 32, and a second level dielectric 36. An adhesive layer 24 connects the flex circuit 38 to the cap wafer 20. The first level dielectric serves to protect the circuitry 32 from the adhesive bond layer 24. The second level dielectric 36 serves to protect the circuitry 32 from external hazards and is arranged in a way so that is creates a gap 35 in the second level dielectric 36 which allows access to the circuitry 32. External devices connect to the circuitry 32 through this gap 35 in the second level dielectric 36. This alternative embodiment may be used in lieu of direct fabrication of circuitry onto the cap wafer.

Figure 12:
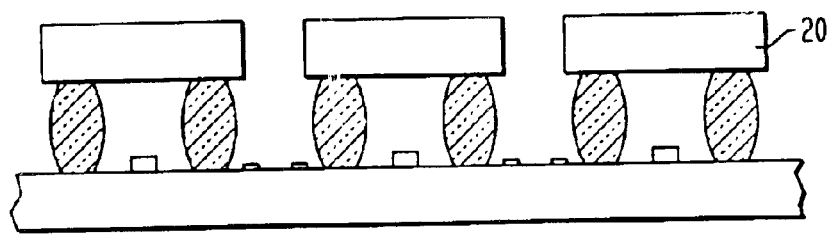
FIG. 12 shows a cross-sectional view of a further step of the invention.
Figure 13:
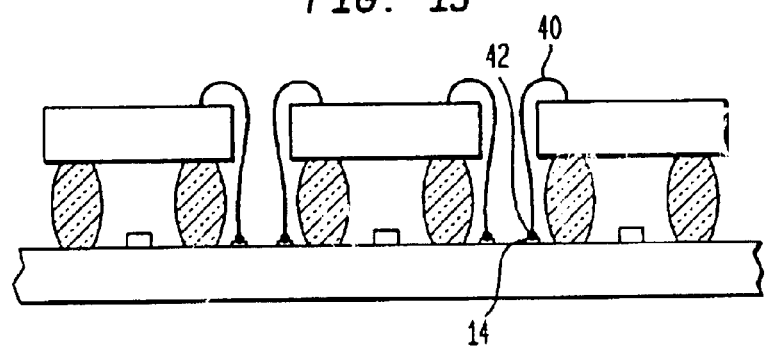
FIG. 13 shows a cross-sectional view of a further step of the invention.

After the cap wafer 20 is sealed to the substrate wafer 10, the next step in the process of the invention is to separate the cap wafer so that the unnecessary portions of the cap wafer are removed and access can be gained to the underlying portions of the substrate wafer. FIG. 12 shows this step of the invention. In the preferred embodiment of the invention, the cap wafer 20 is separated by a wafer saw so that only the necessary portions of cap wafer remain. The next step of the invention process is shown in FIG. 13. During this step, wire bond 40 is attached to the cap wafer circuit 30 and is connected to the electronic connection 14 of the microstructure 12. The wire bond is typically applied by the use of a capillary which bonds the wire to the circuitry on the cap wafer, spools the wire to the electrical connectors 14 on the microstructure wafer and bonds the wire there. The capillary then severs the wire and moves to the next microstructure. In the preferred embodiment, the wire bond is made of gold but can be made of other similar materials such as aluminum. At the base of the connection of the wire bond 40 to the MEMS connector 14, a ball of wire bond 42 is formed by sealing the wire bond 40 to the connector 14.

Figure 14:
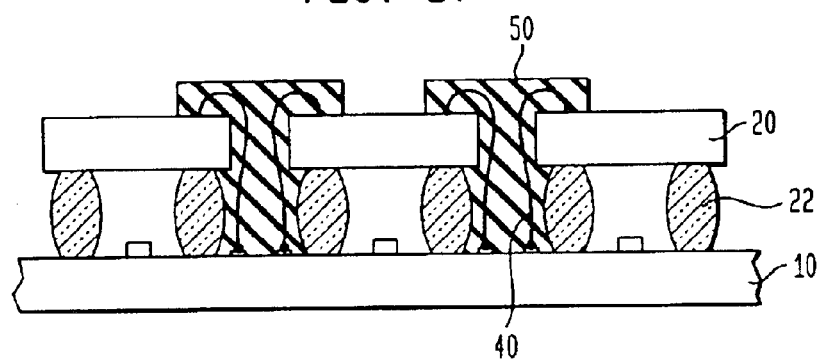
FIG. 14 shows a cross-sectional view of a further step of the invention.

During the next step of the process, an overmold 50, preferably an epoxy in liquid form filled with silica to reduce thermal expansion, is poured between the microstructure glass seals 22. The overmold then cools and then serves to protect the wire bond 40 which connects the cap wafer 20 to the substrate wafer 10. The completion of this step is shown in FIG. 14.

Figure 15:
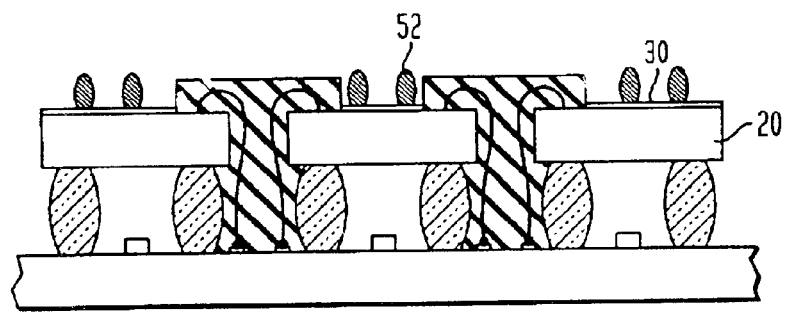
FIG. 15 shows a cross-sectional view of a further step of the invention.

The next step is to attached solder balls 52 to the cap wafer circuit 30. This is shown in FIG. 15. External applications connect through the solder balls 52 to the cap wafer and through it connect to the microstructure 12.

Figure 16:
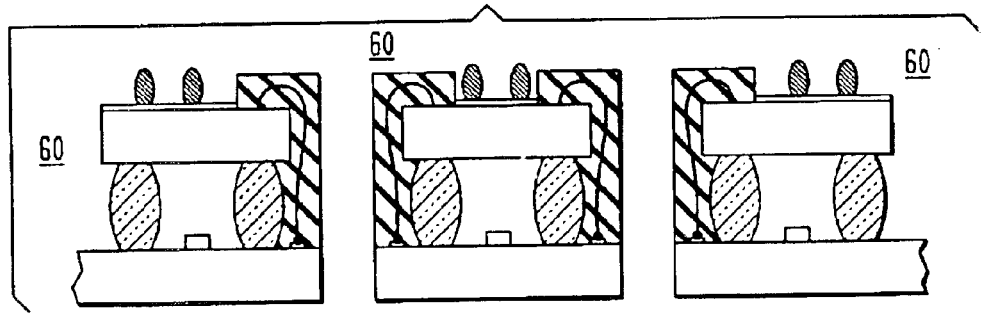
FIG. 16 shows a cross-sectional view of a completed invention, a singulated hermetic wafer scale package with a MEMS device.

The final step is to singulate the hermetically sealed wafer scale packaged MEMS. In the preferred embodiment, a wafer saw is used to cut through the overmold 50 and create the singulated packages 60. The result of this step is shown in FIG. 16. The final packages are wafer scale, or "chip-sized." This means that the final packages are the same size as the singulated devices. There is no external casing required which changes the size of the final package.

In between any of the steps above, the manufacturing process could be halted and testing could be performed on the individual microstructure packages or on the entire wafer. This ability to test at the wafer level contributes to the low cost of these microstructure devices.

Having thus described at least one illustrated embodiment of the invention, various alterations, modifications, and improvements will readily occur to those skilled in the art.

Such alterations, modifications, and improvements are intended to be in the spirit of the invention. Accordingly, the foregoing description is by way of example only and is not intended as limiting.

What is claimed is:

1. A process for manufacturing microstructure packages, comprising steps of:

hermetically sealing a plurality of microstructures on a substrate, each microstructure being hermetically sealed within an individual cavity that is not completely filled during the sealing process, thereby allowing movement of the microstructure within the cavity;

providing electrical connections to the individual microstructures;

disposing a protective dielectric substance over the electrical connections while the substrate is intact; and dividing the substrate having the microstructures sealed thereon into sections so as to form individual microstructure assemblies.

2. The process of claim 1, wherein the step of providing electrical connections comprises electrically connecting each microstructure to circuitry on or in an upper portion of the seal for that microstructure.

3. The process of claim 2, wherein the step of electrically connecting comprises:

electrically connecting each microstructure to corresponding circuitry on or in the substrate; and electrically connecting the corresponding circuitry on or in the substrate for each microstructure to the circuitry on or in the upper portion of the seal for that microstructure.

4. The process of claim 3, wherein the step of electrically connecting further comprises using wire bonds to electrically connect the circuitry on or in the substrate for each microstructure to the circuitry on or in the upper portion of the seal for that microstructure.

5. The process of claim 4, wherein the step of disposing the protective dielectric substance over the electrical connections comprises disposing an overmold over the wire bonds.

6. The process of claim 1, wherein the step of hermetically sealing comprises:
surrounding each microstructure with a coolable material;
attaching a cap to the coolable material surrounding each microstructure; and
allowing the coolable material to cool thereby forming hermetically sealed cavities containing the microstructures.

7. The process of claim 6, wherein the coolable material comprises flit glass.

8. The process of claim 6, wherein the cap comprises a wafer that has circuitry fabricated thereon at the time the step of attaching the cap to the coolable material is performed.

9. The process of claim 6, wherein the cap comprises a wafer with an attached flex circuit.

10. The process of claim 1, wherein the step of dividing comprises using a wafer saw to separate-the microstructure assemblies.

11. The process of claim 1, wherein the step of providing electrical connections comprises using wire bonds to electrically connect circuitry on or in the substrate to circuitry on or in upper portions of the seals of the microstructures.

12. The process of claim 1, wherein the step of disposing the protective dielectric substance over the electrical connections comprises disposing an overmold between the microstructure cavities.

13. The process of claim 1, wherein the step of providing electrical connections is performed after the step of hermetically sealing the plurality of microstructures has been performed.

14. The process of claim 1, wherein the plurality of microstructures comprises MEMS devices.

15. The process of claim 1, wherein the step of disposing the protective dielectric substance over the electrical connections comprises disposing an overmold over the electrical connections.

16. The process of claim 1, wherein:
the step of hermetically sealing comprises using a single wafer cap to simultaneously hermetically seal the plurality of microstructures on the substrate; and
the process further comprises a step of removing portions of the single wafer cap while the substrate is intact to provide access to areas thereunder.

17. The process of claim 16, wherein the step of hermetically sealing further comprises attaching the wafer cap to glass surrounding the plurality of microstructures.

18. The process of claim 1, wherein:
the step of hermetically sealing comprises attaching a wafer cap to glass surrounding each microstructure.

19. A process for manufacturing wafer-scale microstructure packages, comprising steps of:
hermetically sealing a plurality of microstructures on a substrate while the substrate is intact, each microstructure being hermetically sealed within a cavity that is not completely filled during the sealing process, thereby allowing movement of the microstructure within the cavity;
separating the substrate having the microstructures sealed thereon into sections so as to form individual microstructure packages; and
before separating the substrate to form the individual microstructure packages, securing electrically conductive leads to each of the packages, the leads being configured and arranged to directly contact circuitry on a circuit board and to electrically connect the microstructure in the package to that circuitry.

20. The process of claim 19, wherein the step of hermetically sealing comprises sealing the microstructures within the cavities so that the microstructures are free to move within the cavities.

21. The process of claim 19, wherein the plurality of microstructures comprises MEMS devices.

22. The process of claim 19, wherein:
the step of hermetically sealing comprises using a single wafer cap to simultaneously hermetically seal the plurality of microstructures on the substrate; and
the process further comprises a step of removing portions of the single wafer cap while the substrate is intact to provide access to areas thereunder.

23. The process of claim 22, wherein the step of hermetically sealing further comprises attaching the wafer cap to glass surrounding the plurality of microstructures.

24. The process of claim 19, wherein:
the step of hermetically sealing comprises attaching a wafer cap to glass surrounding each microstructure.

25. A microstructure package manufactured according to a process, the process comprising steps of:
hermetically sealing a plurality of microstructures on a substrate, each microstructure being hermetically sealed within an individual cavity that is not completely filled during the sealing step, thereby allowing the microstructure to move within the cavity;
providing electrical connections to the individual microstructures;
disposing a protective dielectric substance over the electrical connections while the substrate is intact; and
dividing the substrate having the microstructures sealed thereon into sections so as to form individual microstructure assemblies.

26. The microstructure package manufactured according to the process of claim 25, wherein the process step of providing electrical connections comprises electrically connecting each microstructure to circuitry on or in an upper portion of the seal for that microstructure.

27. The microstructure package manufactured according to the process of claim 26, wherein the step of electrically connecting comprises:
electrically connecting each microstructure to corresponding circuitry on or in the substrate; and
electrically connecting the corresponding circuitry on or in the substrate for each microstructure to the circuitry on or in the upper portion of the seal for that microstructure.

28. The microstructure package manufactured according to the process of claim 27, wherein the step of electrically connecting further comprises using wire bonds to electrically connect the circuitry on or in the substrate for each microstructure to the circuitry on or in the upper portion of the seal for that microstructure.

29. The microstructure package manufactured according to the process of claim 28, wherein the step of disposing the protective dielectric substance over the electrical connections comprises disposing an overmold over the wire bonds.

30. The microstructure package manufactured according to the process of claim 25, wherein the process step of hermetically sealing comprises:

sunrounding each microstructure with a coolable material;

attaching a cap to the coolable material surrounding each microstructure; and allowing the coolable material to cool thereby forming hermetically sealed cavities containing the microstructures.

31. The microstructure package manufactured according to the process of claim 30, wherein the cap comprises a wafer that has circuitry fabricated thereon at the time the step of attaching the cap to the coolable material is performed.

32. The microstructure package manufactured according to the process of claim 30, wherein the cap comprises a wafer with an attached flex circuit.

33. The microstructure package manufactured according to the process of claim wherein the coolable material comprises frit glass.

34. The microstructure package manufactured according to the process of claim 25, wherein the process step of dividing comprises using a wafer saw to separate the microstructure assemblies.

35. The microstructure package manufactured according to the process of claim 25, wherein the process step of providing electrical connections comprises using wire bonds to electrically connect circuitry on or in the substrate to circuitry on or in upper portions of the seals of the microstructures.

36. The microstructure package manufactured according to the process of claim 25, wherein the process step of disposing the protective dielectric substance over the electrical connections comprises disposing an overmold between the microstructure cavities.

37. The microstructure package manufactured according to the process of claim 25, wherein the step providing electrical connections is performed after the step of hermetically sealing the plurality of microstructures.

38. The microstructure package manufactured according to the process of claim 25, wherein the plurality of microstructures comprises MEMS devices.

39. The microstructure package manufactured according to the process of claim 25, wherein the step of disposing the protective dielectric substance over the electrical connections comprises disposing an overmold over the electrical connections.

40. The microstructure package manufactured according to the process of claim 25, wherein:

the process step of hermetically sealing comprises using a single wafer cap to simultaneously hermetically seal the plurality of microstructures on the substrate; and the process further comprises a step of removing portions of the single wafer cap while the substrate is intact to provide access to areas thereunder.

41. The microstructure package manufactured according to the process of claim 40, wherein the process step of hermetically sealing further comprises attaching the wafer cap to glass surrounding the plurality of microstructures.

42. The microstructure package manufactured according to the process of claim therein the process step of hermetically sealing comprises attaching a wafer cap to glass surrounding each microstructure.

43. A microstructure package manufactured according to a process, the process comprising the following steps:

hermetically sealing a plurality of microstructures on a substrate while the substrate is intact, each microstructure being hermetically sealed within a cavity that is not completely filled during the sealing process, thereby allowing the microstructure to move within the cavity;

separating the substrate having the microstructures sealed thereon into sections so as to form individual microstructure packages; and before separating the substrate to form the individual microstructure packages, securing electrically conductive leads to each of the packages, the leads being configured and arranged to directly contact circuitry on a circuit board and to electrically connect the microstructure in the package to that circuitry.

44. The microstructure package manufactured according to the process of claim 43, wherein the plurality of microstructures comprises MEMS devices.

45. The microstructure package manufactured according to the process of claim 43, wherein:

the process step of hermetically sealing comprises using a single wafer cap to simultaneously hermetically seal the plurality of microstructures on the substrate; and the process further comprises a step of removing portions of the single wafer cap while the substrate is intact to provide access to areas thereunder.

46. The micro structure package manufactured according to the process of claim 45, wherein the process step of hermetically sealing further comprises attaching the wafer cap to glass surrounding the plurality of microstructures.

47. The microstructure package manufactured according to the process of claim 43, wherein the step of hermetically sealing comprises attaching a wafer cap to glass surrounding each microstructure.

48. A process for manufacturing MEMS device packages, comprising steps of:

hermetically sealing a plurality of MEMS devices on a substrate, each MEMS device being hermetically sealed within an individual cavity;

providing electrical connections to the individual MEMS devices;

disposing a protective dielectric substance over the electrical connections while the substrate is intact; and dividing the substrate having the MEMS devices hermetically sealed thereon into sections so as to form individual MEMS device assemblies.

49. A process for manufacturing MEMS device packages, comprising steps of:

hermetically sealing a plurality of MEMS devices on a substrate while the substrate is intact;

separating the substrate having the MEMS devices hermetically sealed thereon into sections so as to form individual MEMS device packages; and before separating the substrate to form the individual microstructure packages, securing electrically conductive leads to each of the packages, the leads being configured and arranged to directly contact circuitry on a circuit board and to electrically connect the microstructure in the package to that circuitry.

* * * * *